United States Patent [19]

Varley

[11] Patent Number: 5,594,985
[45] Date of Patent: Jan. 21, 1997

[54] END PIN EXTRACTOR FOR SEMICONDUCTOR STORAGE TUBE

[75] Inventor: Jerry M. Varley, Whitesboro, Tex.

[73] Assignee: Texas Instruments Incorporated, Dallas, Tex.

[21] Appl. No.: 436,776

[22] Filed: May 8, 1995

[51] Int. Cl.$^6$ ..................................................... B23P 19/04
[52] U.S. Cl. .............................. 29/823; 29/244; 221/197; 227/116
[58] Field of Search ............................. 29/822, 823, 809, 29/244; 221/151, 152, 153, 197, 13, 23, 270, 274; 227/115, 116

[56] References Cited

U.S. PATENT DOCUMENTS

| | | | |
|---|---|---|---|
| 4,648,773 | 3/1987 | Bieganski | 221/197 |
| 4,835,848 | 6/1989 | Schimmel et al. | 29/823 X |
| 4,993,588 | 2/1991 | Wiblberg et al. | 29/809 X |

*Primary Examiner*—Peter Vo
*Assistant Examiner*—Khan V. Nguyen
*Attorney, Agent, or Firm*—W. James Brady, III; Richard L. Donaldson

[57] ABSTRACT

The invention is to an extractor for removing pins from storage tubes having a plurality of electronic semiconductor devices therein. A movable arm has an extractor pin on one end and is pivotally mounted to a frame on the other end. A head assembly for receiving a storage tube with a pin therein is moved under the extractor pin, actuating a solenoid for causing the movable arm to move the extractor pin toward and forcing the pin to be ejected from the storage tube so that the semiconductor devices can exit the storage tube.

10 Claims, 6 Drawing Sheets

END PIN EXTRACTOR FOR SEMICONDUCTOR STORAGE TUBE

FIELD OF THE INVENTION

This invention relates to semiconductor storage devices, and more particularly to an extractor for removing end pins for semiconductor storage tubes.

BACKGROUND OF THE INVENTION

Semiconductor devices, including integrated circuits are stored in plastic tubes to protect the devices, and particularly the leads to prevent damage such as bending and breaking. The storage tubes have a platform extending through the center of the tube on which the body of the device is supported with the conductor leads on each side of the device separated by the platform. Each end of the tube has a resilient pin that is inserted into and extends through the tube, and prevents the devices from falling out of the tube. Since the tube has to remain in the tube without falling out, the end of the pin is slightly enlarged to hold the pin in the end of the tube and remain there until it is forcibly removed. The pin is presently manually pulled using a hand tool that removes the pin. The repeated pulling of such pins is tiring to the hand and arm, and places the operator under strain after a period of time.

SUMMARY OF THE INVENTION

The invention is to an extractor for removing pins from storage tubes. A movable arm has an extractor pin on one and is pivotally mounted to a frame on the other end. A head assembly for receiving a storage tube with a pin therein is moved on at least one track under the extractor pin and actuates a solenoid, with a solenoid arm therein, causing the movable arm to rotate about the pivotal end moving the extractor pin against the pin in a storage tube, removing the pin.

The technical advance represented by the invention, as well as the objects thereof, will become apparent from the following description of a preferred embodiment of the invention when considered in conjunction with the accompanying drawings, and the novel features set forth in the appended claims.

DESCRIPTION OF A PREFERRED EMBODIMENT

Figure 1:
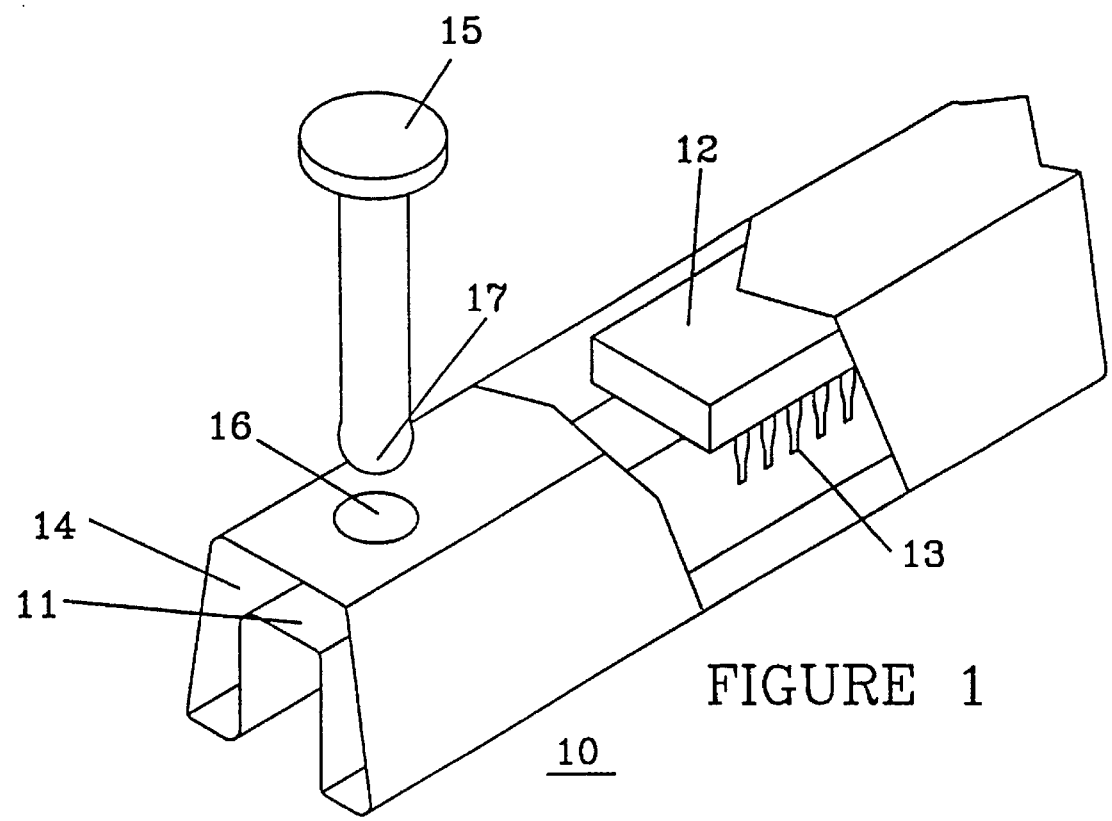
FIG. 1 is a semiconductor device storage tube and end pin.

FIG. 1 is a semiconductor device storage tube that utilizes a pin-lock to hold semiconductor devices in the magazine. Magazine 10 has a platform 11 on which devices 12 are placed through opening 14 in the end of the magazine, with the device pins 13 on each side of platform 11. Pin 15 (there is one in each end of the magazine) prevents semiconductor devices 12 from sliding out of magazine 10. Pin 15 is inserted in holes 16 and is secured in the hole by enlarged pin end 17, which is slightly larger than the hole. Because the plastic from which the magazine is made is resilient, the enlarged end 17 may be forced through the hole 16, and then pulled out when devices 12 are to be removed from magazine 10.

Figure 2:
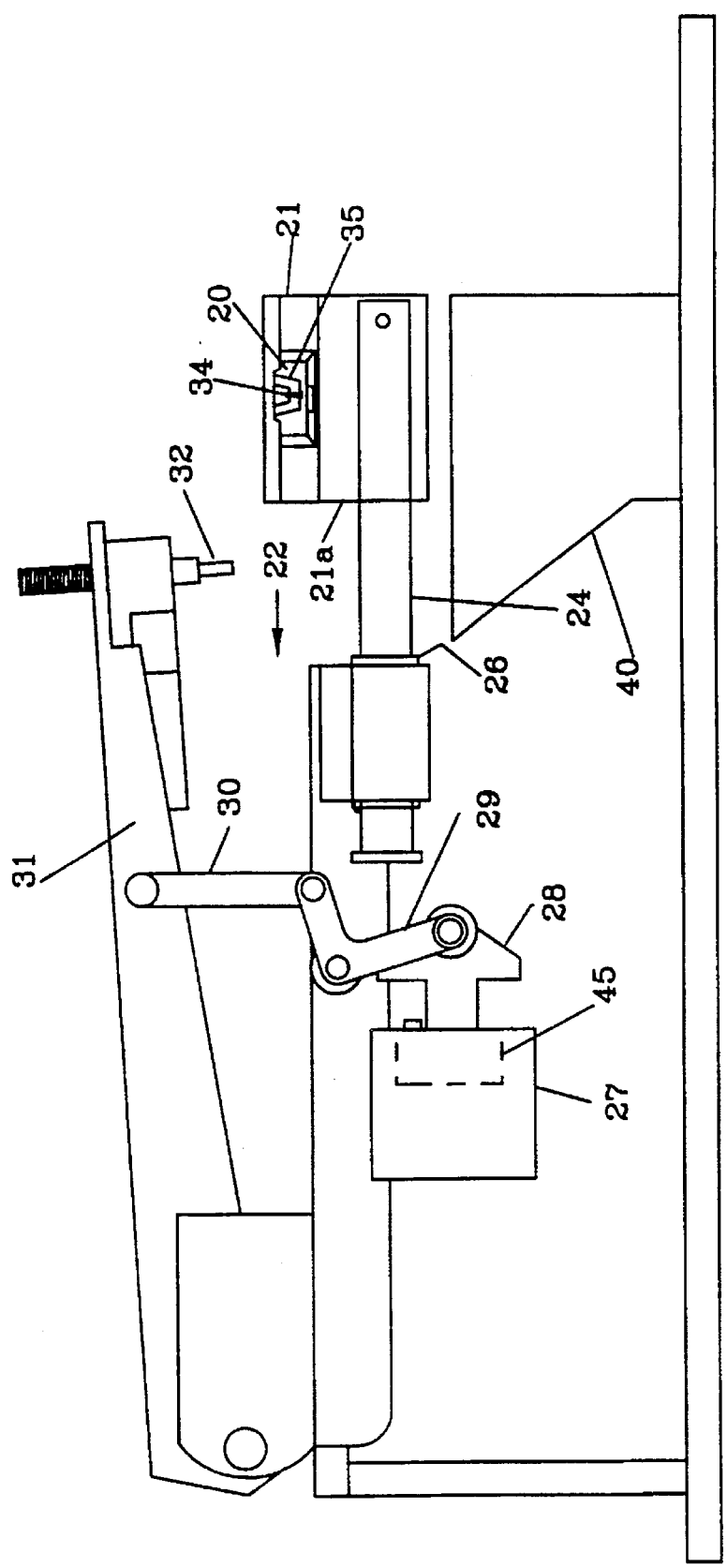
FIG. 2 illustrates the basic structure of the invention in a first position.
Figure 3:
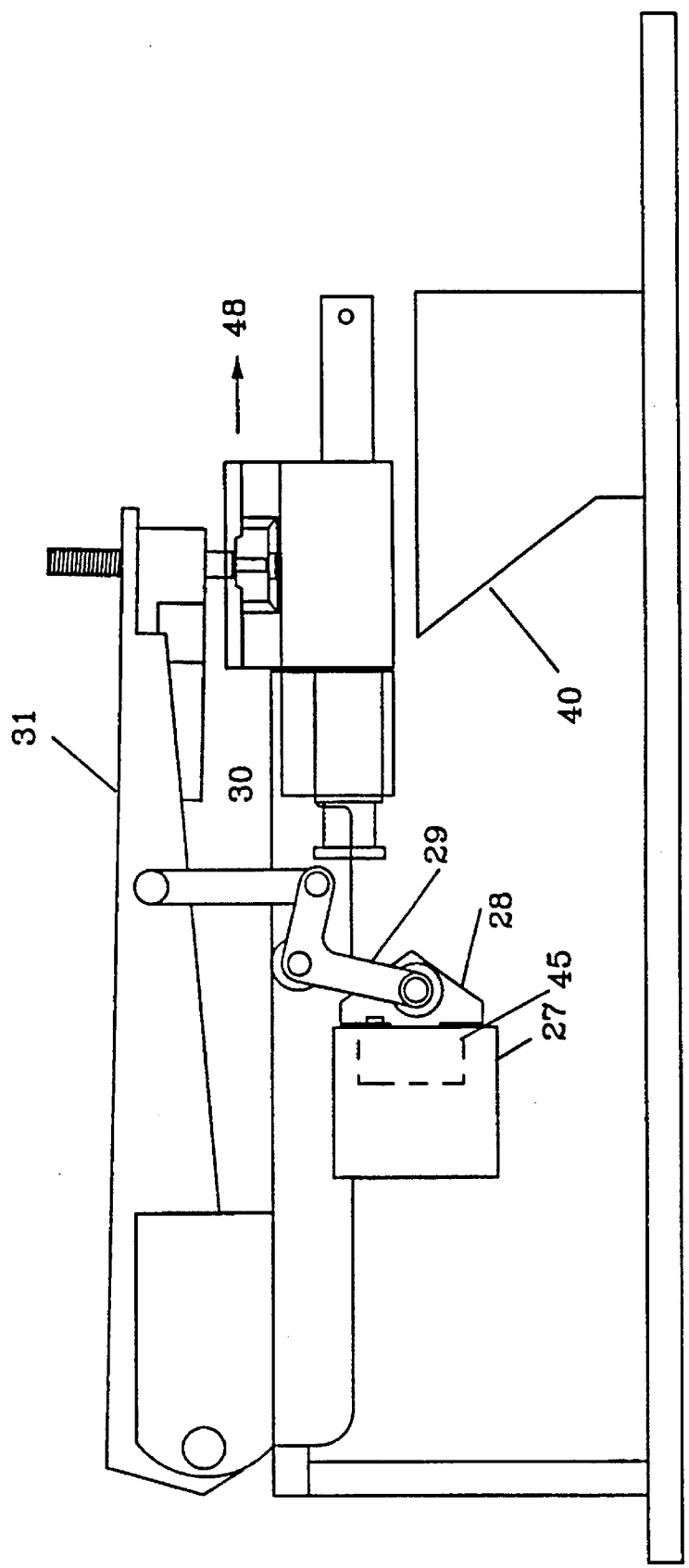
FIG. 3 illustrates the basic structure of the invention in a second position.

FIGS. 2 and 3 illustrate the basic structure of the invention in a first raised position and in a second lowered position. The invention is an end pin extractor for removing plastic pins from the ends of plastic sleeves (tubes), as illustrated in FIG. 1, which hold integrated circuits and semiconductor devices. In operation, a sleeve 35 is inserted into tube slot 20 in head assembly 21. Head assembly 21 with sleeve 35 in slot 20, is moved inward, as shown by arrow 22, on two steel slides 24 ands 25 until the back 21a of head assembly 21 makes contact with down micro switch 26. Switch 26 activates solenoid 27, which, through solenoid arm 28 and linkage 29 and 30, pulls extractor arm 31 downward. When extractor arm 31 moves downward (FIG. 3), extractor punch 32 makes contact with the end pin 34 in the sleeve 35, and pushes it out of sleeve 35. The pin 34 falls into pin chute 40 (FIG. 4), and into the extracted pin bin 41. Solenoid arm 28, while still traveling inward, makes contact with the up micro switch 45, and deactivates solenoid 27.

A spring inside extractor arm 31 (not illustrated) pulls the extractor arm 31 back to its original at rest position when there is no power on solenoid 27. The operator pulls the sleeve 35 outward in the direction of arrow 48, moving head assembly 21 back to its at rest position. The sleeve 35 without pin 34 is then removed from the head assembly 21.

Figure 4:
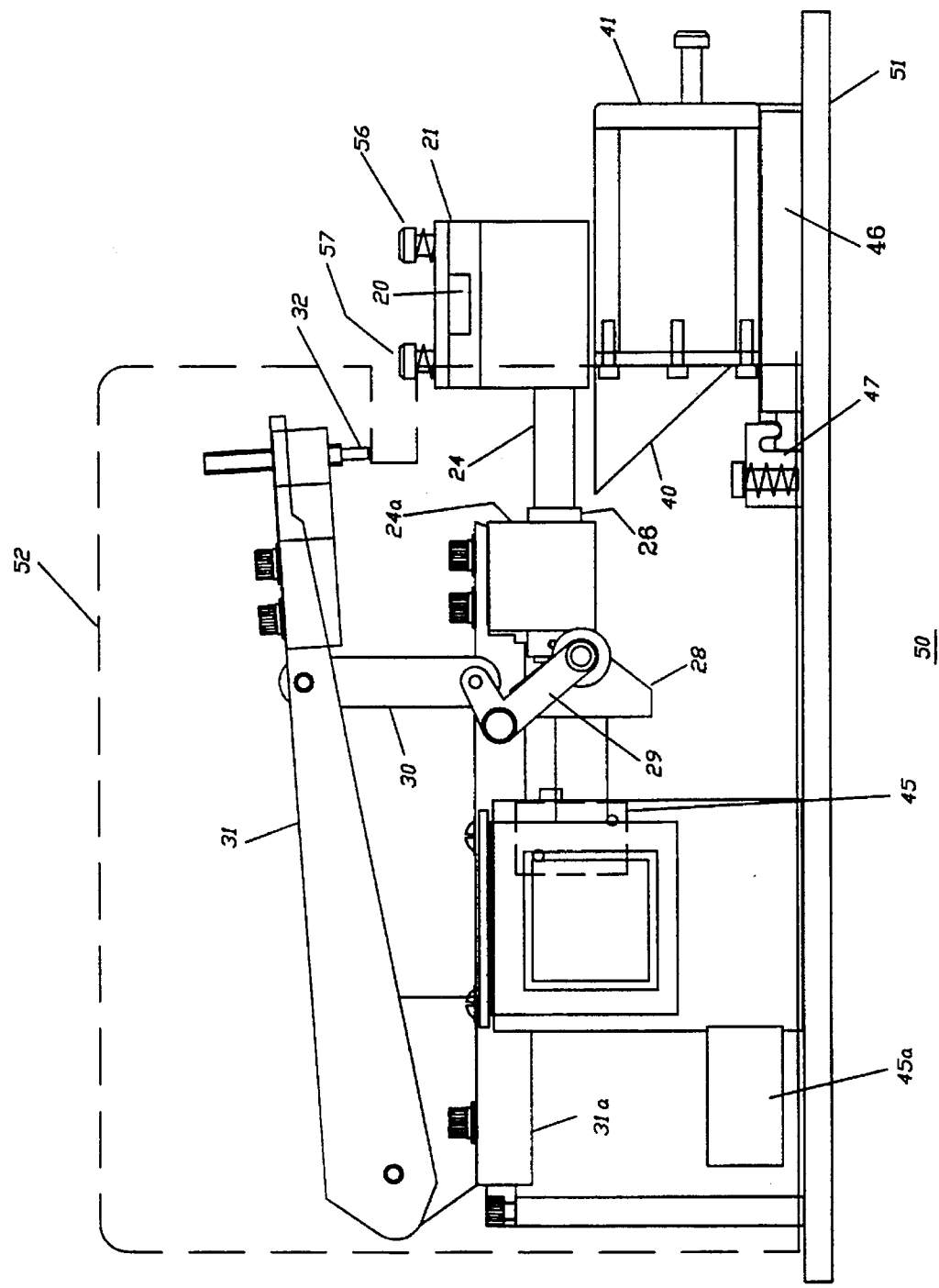
FIG. 4 illustrates a detailed structure of the invention.

FIG. 4 is a side view of the invention showing more details of the structure. Pin extractor 50 has base 51 on which is mounted extractor arm base 31a, pin bin latch 47, and extractor pin bin slide 46. Extractor arm 31 is on one end of base 31a and slide mount 24a is on the other end. Solenoid 27 is secured to the underside of arm base 31a. Head assembly 21 slides freely on slide 24 so that head assembly 21 can be moved by the operator under extractor pin 32. When extractor arm 31 is moved downward by solenoid 27, through the action of solenoid arm 28 and links 29 and 30, extractor punch 32 removes the pin 34 (FIGS. 2 and 3), and pin 34 drops into chute 40 and pin bin 41.

Extractor pin bin 41 slides on and is retained in place on pin bin slide 46. Latch 47 holds pin bin 41 in place until it is full of extracted pins, and then, by lifting up latch 47, pin bin 41 is move off from slide 46 to be emptied and then replaced.

A cover 52 encloses the extractor mechanism to protect the operator from the downward motion of the extractor arm 31 and extractor pin 32. Head assembly 21 slides into an opening 60 (FIG. 5) in cover 52.

A control circuit 45a supplies power to solenoid 27 which is activated by micro switch 26 and released by micro switch 46.

Figure 5:
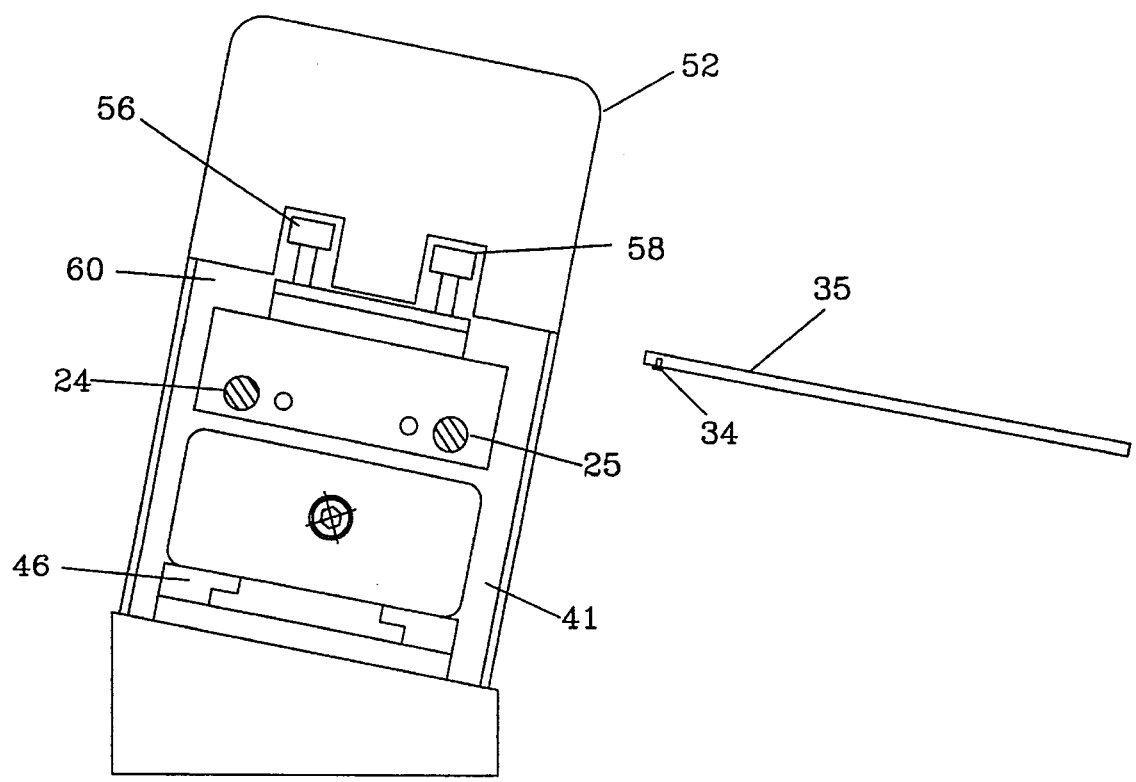
FIG. 5 is an end view of the invention.

FIG. 5 is an end view of extractor 50 showing that the extractor mechanism mounted at an angle. Tube 25 is inserted in head and slide assembly 21 at an angle. This prevents semiconductor devices in sleeve 35 from falling out of sleeve 35 after pin 34 has been extracted, as sleeve 35 is removed from head assembly 21. Head assembly 21 is moved into position under extractor pin 32 on slides 24 and 25. The head assembly (FIG. 6) is held in place by four screws. Two screws, 56 and 58, are shown in FIG. 5. The end of slide assembly 46 on which the pin bin 41 slides is shown in FIG. 5.

Figure 6:
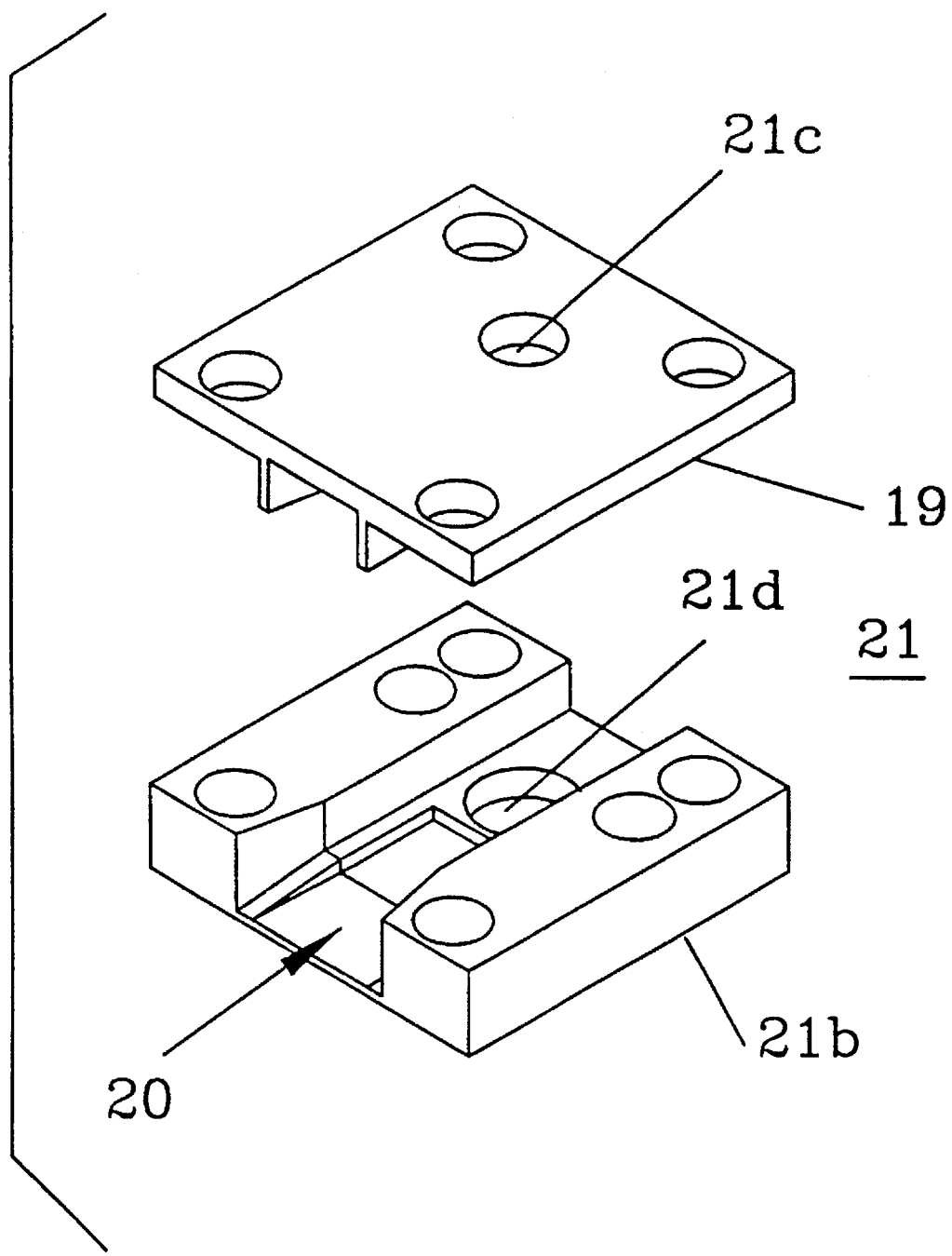
FIG. 6 is a detailed structure of the head assembly.

The detail of the head assembly 21 is shown in FIG. 6. A cover is held in place by four shoulder screws. It may be replaced with similar fittings designed to accommodate other sizes of tubes. Opening 21c is the hole through which extractor pin 32 enters to push a pin out of a tube through hole 21d into chute 40.

What is claimed:

1. An extractor for automatically removing pins from storage tubes, comprising:

a movable arm having first and second ends;

an extractor pin on a first end of said movable arm;

a head assembly for receiving a storage tube with a pin therein;

at least one track on which the head assembly travels when moved under the extractor pin; and a solenoid, with a solenoid arm therein for causing said movable arm to rotate about said second end to remove a pin from a storage tube in said head assembly.

2. The extractor according to claim 1, including a power supply, a first micro switch, actuated by said head assembly, for supplying power to said solenoid from the power supply for rotating said movable arm to remove the pin from the storage tube, and a second micro switch actuated by said solenoid arm for removing power from said solenoid.

3. The extractor according to claim 1, including a spring associated with said movable arm for returning the movable arm to a raised position after removing a pin form a storage tube.

4. The extractor according to claim 1, including a pin storage bin located under said head assembly for receiving and storing removed pins.

5. The extractor according to claim 1, wherein said solenoid arm is connected to said movable arm by linkage arms which pull the movable arm down to move the extractor pin into contact with a storage tube pin.

6. An extractor for automatically removing pins from storage tubes, comprising:

a movable arm having first and second ends;

an extractor pin on a first end of said movable arm;

a manually movable head assembly for receiving a storage tube with a pin therein;

at least one track on which the head assembly travels when moved under the extractor pin;

a solenoid, with a solenoid arm therein for causing said movable arm to rotate about said second end to remove a pin from a storage tube in said head assembly; and first and second micro switches, said first micro switch for actuation said solenoid, and said second micro switch for deactivating said solenoid.

7. The extractor according to claim 6, including a power supply, for supplying power to said solenoid, said first micro switch, actuated by said head assembly, for rotating said movable arm to remove the Pin from the storage tube, and said second micro switch actuated by said solenoid arm for removing power from said solenoid.

8. The extractor according to claim 6, including a spring associated with said movable arm for returning the movable arm to a raised position after removing a pin form a storage tube.

9. The extractor according to claim 6, including a pin storage bin located under said head assembly for receiving and storing removed pins.

10. The extractor according to claim 6, wherein said solenoid arm is connected to said movable arm by linkage arms which pull the movable arm down to move the extractor pin into contact with a storage tube pin.

\* \* \* \* \*